United States Patent
Tie et al.

(10) Patent No.: US 6,599,775 B2
(45) Date of Patent: Jul. 29, 2003

(54) METHOD FOR FORMING A FLIP CHIP SEMICONDUCTOR PACKAGE, A SEMICONDUCTOR PACKAGE FORMED THEREBY, AND A SUBSTRATE THEREFOR

(75) Inventors: Wang Tie, Singapore (SG); Miao Ping, Singapore (SG); Chew Tham Heang, Singapore (SG)

(73) Assignee: Advanpack Solutions Pte Ltd (SG)

( * ) Notice: Subject to any disclaimer, the term of this patent is extended or adjusted under 35 U.S.C. 154(b) by 0 days.

(21) Appl. No.: 09/860,664

(22) Filed: May 18, 2001

(65) Prior Publication Data

US 2002/0173075 A1 Nov. 21, 2002

(51) Int. Cl.[7] ............................................... H01L 21/00
(52) U.S. Cl. ...................................................... 438/108
(58) Field of Search ........................... 438/108; 257/678, 257/737, 777, 779, 780, 782, 795

(56) References Cited

U.S. PATENT DOCUMENTS 5,128,746 A * 7/1992 Pennisi et al. ............... 257/738
6,180,696 B1 * 1/2001 Wong et al. ................. 523/457
6,337,522 B1 * 1/2002 Kang et al. .................. 257/784

* cited by examiner

Primary Examiner—William David Coleman
(74) Attorney, Agent, or Firm—Lawrence Y.D. Ho & Assoc's.

(57) ABSTRACT

A method of forming an underfilled semiconductor package comprises the steps of: providing a substrate (300) with raised terminal portions (305), disposing underfill compound (5) with filler (27) on the substrate (300), placing a bumped semiconductor die (40) on the substrate (300) with bumps (45) abutting upper surfaces (310) of the raised terminal portions (305), and reflowing the assembly. During the reflow process, the raised terminal portions (305) and the bumps (45) melt and displace the filler (27) in the underfill compound (5) away from between the bumps (45) and the raised terminal portions (305). This prevents the filler (27) from forming a barrier. The molten solder forms interconnects between the pads (46) and the raised terminal portions (305).

34 Claims, 7 Drawing Sheets

METHOD FOR FORMING A FLIP CHIP SEMICONDUCTOR PACKAGE, A SEMICONDUCTOR PACKAGE FORMED THEREBY, AND A SUBSTRATE THEREFOR

FIELD OF THE INVENTION

The present invention relates to forming a flip chip semiconductor package with underfill, and more particularly to forming a flip chip semiconductor package with no-flow underfill.

BACKGROUND OF THE INVENTION

Flip chip semiconductor packages formed with underfill material, which is also referred to simply as underfill, are known. Such a flip chip package comprises a semiconductor die which has a pattern of pads on one surface; a substrate with corresponding terminals on a pattern of conductors on a first surface, and a second surface, opposite the first surface, with a pattern of external conductors; solder interconnects that couple the die pads to the terminals; and underfill that fills the gap between the die and the substrate.

A relatively well known, method of forming a flip chip package is to first raise or bump the pads on the semiconductor die with solder, then flip the semiconductor die over and place it with the bumps on the terminals. When the assembly of the semiconductor die, substrate and solder bumps is reflowed, the solder between the pads and terminals melt to form solder interconnects between the pads and the corresponding terminals.

Subsequently, the underfill is applied at the edges of the gap between the flipped semiconductor die and the substrate. Typically, the underfill is an epoxy-based liquid with a viscosity that significantly decreases under elevated temperature. Through capillary action, and under the elevated temperature, the underfill is drawn in, flows into, and fills the gap between the semiconductor die and the substrate.

The process of filling the gap with underfill presents a variety of difficulties, most of which relate to incomplete filling of the gap with the underfill, especially when bump pitch and height become smaller. For example when the pitch is less than 150 $\mu$m, and the height is less than 50 $\mu$m.

A relatively new method of forming a flip chip package attempts to shorten the process flow and in particular overcome the problems of applying underfill using no-flow underfill. U.S. Pat. No. 6,180,696, assigned to Georgia Tech Research Corporation of the USA, discloses a composition of no-flow underfill, and U.S. Pat. No. 5,128,746 by Pennisi et al., assigned to Motorola Inc. of the USA discloses a method for using no-flow underfill to form a semiconductor package.

With this method, a composition of no-flow underfill is applied to a first surface of a substrate that has the terminals thereon, where the no-flow underfill covers or submerges the terminals. Then, the bumped semiconductor die is flipped and placed on the first surface of the substrate so that the bumps on the semiconductor die abut the terminals. The assembly is then reflowed so that the bumps will change to molten state and form interconnects between the pads and the terminals, with the underfill filling the gap between the die and the substrate. Hence, this method can substantially address the problems and difficulties associated with incomplete filling of the gap between the substrate and the semiconductor die with underfill.

Typically, no-flow underfill is an epoxy based organic compound and as is known by those skilled in the art, the coefficient of thermal expansion (CTE) of an organic compound is relatively high, in the range of 50~90 parts per million per degree Celsius (ppm/° C.). Underfill with a high CTE is unable to efficiently ameliorate the mismatch between the CTE of the semiconductor die and the CTE of the substrate. Consequently, due to this mismatch in CTE, the solder joints between the pads of the semiconductor chip and the substrate in a semiconductor package are prone to thermo-mechanical failure. Thus, adversely affecting the reliability of such no-flow underfilled semiconductor package.

In flip chip semiconductor packages with smaller dies, say less than 5 millimeters (mm)×5 mm, the CTE mismatch is tolerable, in that reliability tends to meet specified limits. However, with larger dies of 10 mm×10 mm and above, the CTE mismatch is more acute and the reliability is not within specified limits. Consequently, no-flow underfill is generally considered to be unsuitable for packaging such larger dies due to its poor CTE characteristics.

One known method of improving i.e. lowering the CTE of an underfill composition is by adding inorganic fillers such as silica to the underfill composition. However, no-flow underfill with filler results in open circuits between the pads on the semiconductor die and the terminals on the substrate.

BRIEF SUMMARY OF THE INVENTION

The present invention seeks to provide a method for forming an underfilled semiconductor package, a semiconductor package formed thereby and a substrate therefor, which overcomes or at least reduces the abovementioned problems of the prior art.

Accordingly, in one aspect, the present invention provides a method for forming a flip chip semiconductor package, the method comprising the steps of:

a) providing a substrate having a first surface with plurality of raised terminal portions, wherein the plurality of raised terminal portions extend to at least the first surface, each of the raised terminal portions comprising a base portion and a free end portion, and at least the free end portions consisting of a first material having a first reflow temperature;

b) providing a semiconductor die having a plurality of pads on a first surface, wherein the plurality of pads have bumps thereon, each of the bumps comprising a base portion and a free end portion, at least the free end portions of the plurality of bumps consisting of the first material;

c) providing an underfill compound, wherein the underfill compound includes at least some inorganic filler to reduce the coefficient of thermal expansion (CTE) of the underfill compound;

d) disposing the underfill compound on the substrate;

e) placing the semiconductor die on the substrate with the underfill compound therebetween, wherein the free end portions of the plurality of bumps abut the free end portions of the plurality of raised terminal portions; and f) reflowing the semiconductor die, the substrate and the underfill compound at substantially the first reflow temperature to form the at least the free end portions of the plurality of bumps and the at least the free end portions of the plurality of raised terminal portions into interconnects.

In another aspect the present invention provides a method for forming a flip chip semiconductor package, the method comprising the steps of:

a) providing a substrate having a first surface with a plurality of raised terminal portions, wherein the plurality of raised terminal portions extend to at least the first surface, each of the raised terminal portions comprising a base portion and a free end portion, at least the free end portions consisting of a first material having a first reflow temperature, wherein the first material is selected from the group consisting of tin-lead eutectic solder and lead-free solder;

b) providing a semiconductor die having a plurality of pads on a first surface, wherein the plurality of pads have bumps thereon, each of the bumps comprising a base portion and a free end portion, at least the free end portions of the plurality of bumps consisting of the first material;

c) providing an underfill compound, wherein the underfill compound includes at least some inorganic filler to reduce the coefficient of thermal expansion (CTE) of the underfill compound, wherein the inorganic filler is selected from the group consisting of silica, silicon nitride, boron nitride, and aluminum nitride;

d) disposing the underfill compound on the substrate;

e) placing the semiconductor die on the substrate with the underfill compound therebetween, wherein the free end portions of the plurality of bumps abut the free end portions of the plurality of raised terminal portions; and f) reflowing the semiconductor die, the substrate and the underfill compound at substantially the first reflow temperature to form the at least the free end portions of the plurality of bumps and the at least the free end portions of the plurality of raised terminal portions into interconnects.

In yet another aspect the present invention provides a flip chip semiconductor package comprising:

a substrate having a plurality of raised terminal portions on a first surface and having a plurality of external interconnects;

a semiconductor die having a plurality of pads on a surface, the semiconductor die being flipped and disposed on the substrate with the first surface of the substrate opposite the surface of the semiconductor die, wherein the semiconductor die has a minimum area of 100 square millimeters;

a plurality of reflowed conductive interconnects extending between and electrically coupling the plurality of pads to the plurality of terminals; and underfill compound filling between the first surface of the substrate and the surface of the semiconductor die, wherein the underfill compound includes at least some inorganic filler.

In still another aspect the present invention provides a substrate for a flip chip semiconductor package comprising:

an electrically non-conductive base layer;

a patterned layer of electrically conductive material disposed on the non-conductive base layer, the patterned layer of electrically conductive material having terminal locations;

a patterned layer of an electrically non-conductive material disposed on the patterned layer of electrically conductive material, the patterned layer of electrically non-conductive material having an exposed surface, and the patterned layer of electrically non-conductive material leaving at least some of the terminal locations uncovered; and raised terminal portions on the terminal locations, wherein the raised terminal portions extend away from the terminal locations to at least the exposed surface of the patterned layer of the electrically nonconductive material.

BRIEF DESCRIPTION OF THE DRAWINGS

An embodiment of the present invention will now be fully described, by way of example, with reference to the drawings of which.

DETAIL DESCRIPTION OF THE DRAWINGS

It has been discovered that open circuits between pads on a semiconductor die and terminals on a substrate in a flip-chip semiconductor package formed using no-flow underfill is caused by the filler in no-flow underfill compositions. The filler forms a mechanical barrier between the solder bumps and terminal locations on the substrate. A method of forming a flip chip package using no-flow underfill with filler and a substrate having raised terminal portions, in accordance with the present invention is disclosed. The raised terminal portions in combination with the bumps on the semiconductor die, displace the filler in the underfill from between the bumps and the raised terminal portions, during reflow. Thus, preventing the filler from forming a barrier, substantially reducing occurrences of open circuits between the bumps and the raised terminal portions. The present invention, as described, advantageously allows no-flow underfill with filler, having the improved lower CTE characteristics, to be used in flip chip semiconductor packages particularly for larger die sizes.

Figure 1:
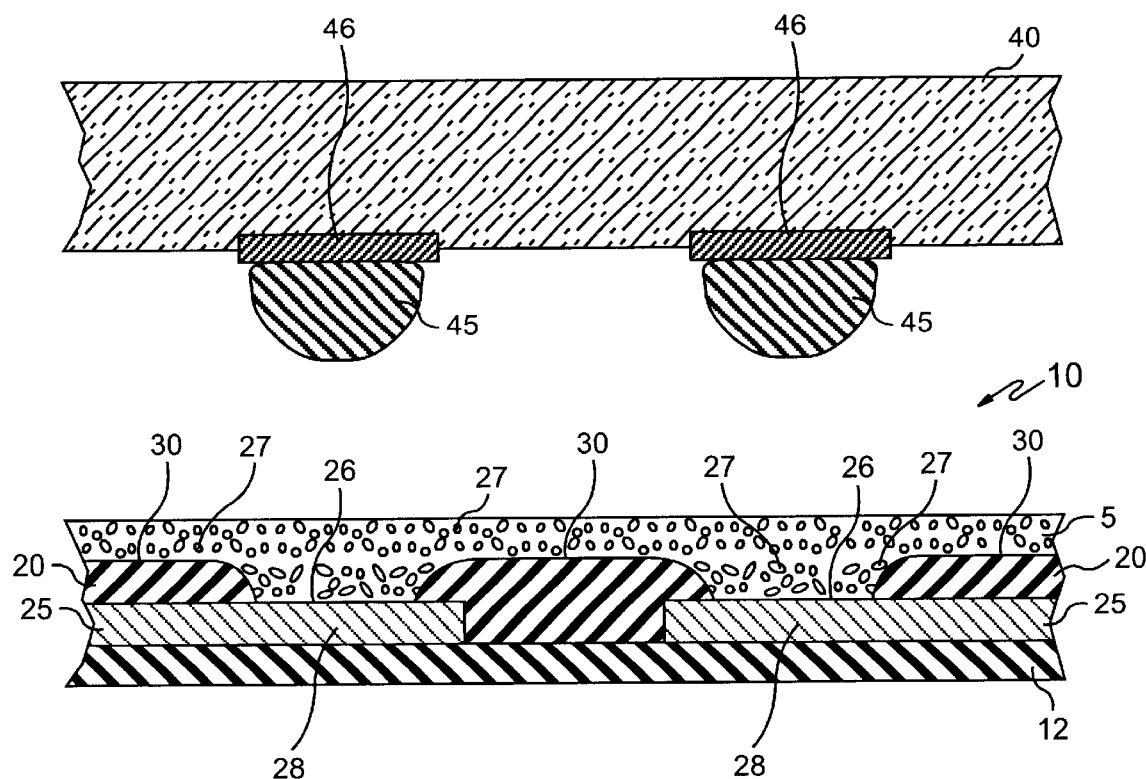
FIG. 1 shows a cross-sectional view of a die and a substrate before assembly in accordance with the prior art.

In accordance with the prior art, FIG. 1 a substrate 10 comprises a sandwich arrangement of a non-conductive base layer 12, a patterned layer of conductors 25 and a patterned solder mask 20, as is known in the art. No-flow underfill 5 with filler 27 is dispensed on the substrate 10, and the no-flow underfill 5 flows over upper surfaces 30 of the solder mask 20 and upper surfaces 26 of terminal locations 28 of patterned conductors 25.

A semiconductor die 40 with bumps 45 on pads 46, is then flipped and placed on the substrate 10, with the bumps 45 aligned over the terminal locations 28 to form an assembly. The assembly is then reflowed by passing it through a reflow oven, and the solder bumps 45 melt to form interconnects between the pads 46 on the die 40 and the terminal locations 28.

Figure 2:
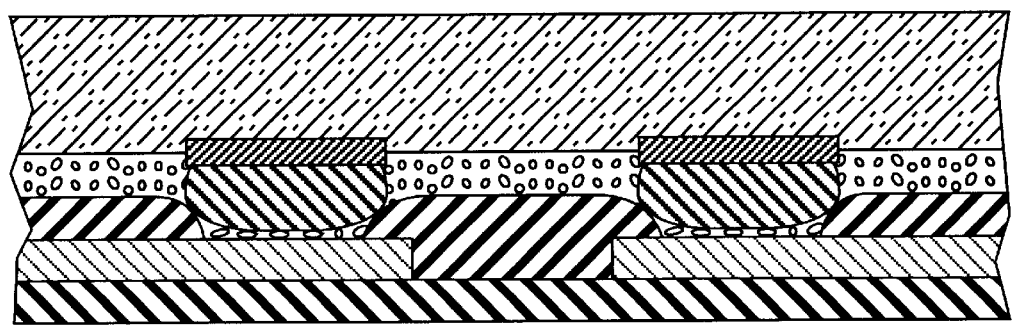
FIG. 2 shows a cross sectional view of the die and the substrate in FIG. 1 after assembly, in accordance with the prior art.

With reference to FIG. 2, in accordance with the prior art, a semiconductor package 200 shows the filler 27 forming a barrier between the bumps 45 and the terminal locations 28. During reflow, the substrate 10 and the die 40 are forced against each other for a period of time, and the reflow temperatures causes the solder bumps 45 to change to a molten state. However, the barrier formed by the filler 27 in the underfill 5 prevents the molten solder from making contact with the terminal locations 28.

Figure 3:
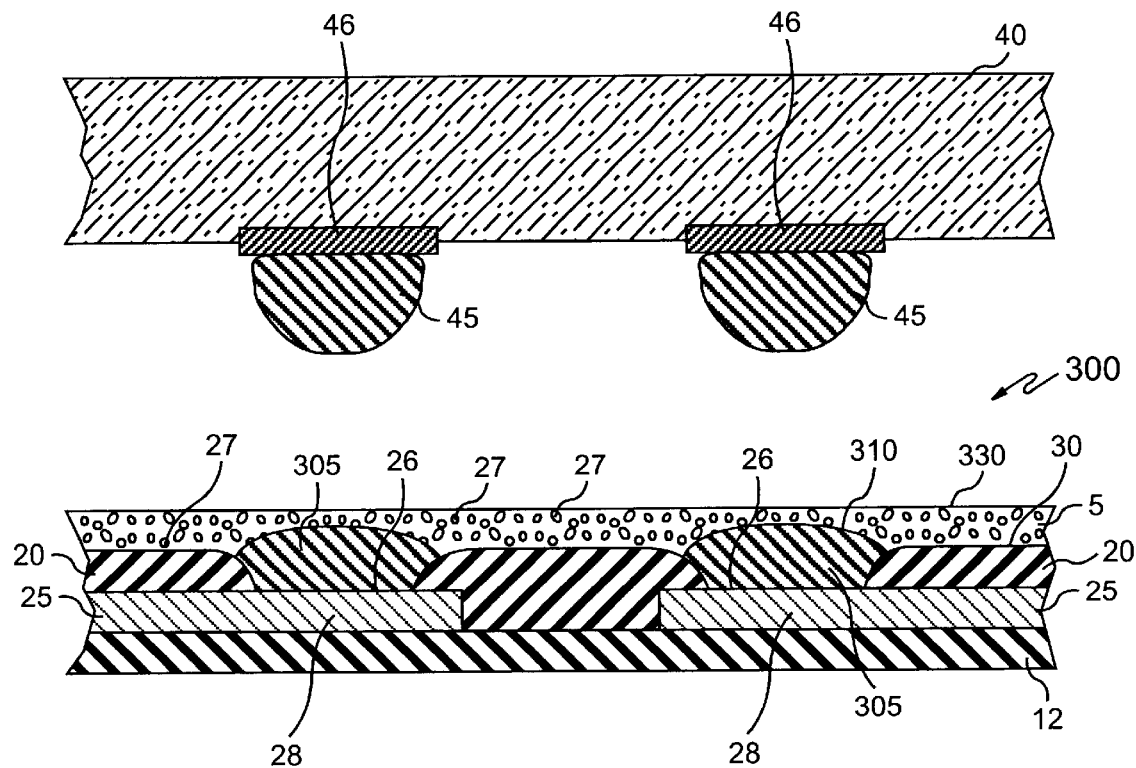
FIG. 3 shows a cross-sectional view of a die and a substrate in accordance with the present invention.

In accordance with the present invention, FIG. 3 shows a substrate 300 having a non-conductive base layer 12, a patterned layer of conductors 25, and a patterned layer of solder mask 20. In addition, a deposit of conductive material, such as solder cladding, is formed on the exposed terminal locations 28 of the patterned layer of conductors 25. The deposit of conductive material forms raised terminal portions 305. The thickness of the solder cladding must be such that upper surface 310 of the raised terminal portion 305 extends, preferably to the same height or higher than the upper surface 30 of the solder mask 20. The substrate 300 includes ceramic, rigid and flexible organic laminate.

No-flow underfill 5 with the filler 27 is disposed on the substrate 300, where the filler 27 can include silica, silicon nitride, boron nitride or aluminum nitride. The no-flow underfill can comprise an epoxy anhydride system, and when more than 50 percent filler by weight is added to the no-flow underfill, a CTE of less than 35 ppm/° C. can be obtained. The difference in height between the upper surface 30 of the solder mask 20 surrounding the terminal locations 28, and the upper surface 310 of the raised terminal portion 305, should be large enough to push away the filler 27 in the underfill 5 during placement of the semiconductor die 40 and reflow of the solder. For example, a difference in height between the upper surface 310 of the raised terminal portions 305 and the upper surface 30 of the solder mask 20 can be made approximately 40~80 micrometers ($\mu$m).

Next, the semiconductor die 40 is positioned with the bumps 45 aligned with the raised terminal portions 305 on the terminal locations 28, after which the die 40 and the substrate 300 are brought together. The bumps 45 and the upper surface 310 of the raised terminal portions 305 make contact, and as the die 40 and the substrate 300 are forced together under pressure in the range of 2~100 N and at an elevated reflow temperatures, the bumps 45 and the raised terminal portions 305 at the terminal locations 28, melt. Filler 27 between the bumps 45 and the raised terminal portions at the terminal locations 28 is pushed away by the molten solder, and the solder forms an interconnect. Of course, this formation of the solder interconnect occurs between all the bumps on the semiconductor die 40 and the raised terminal portions 305 on the substrate 300.

Figure 4:
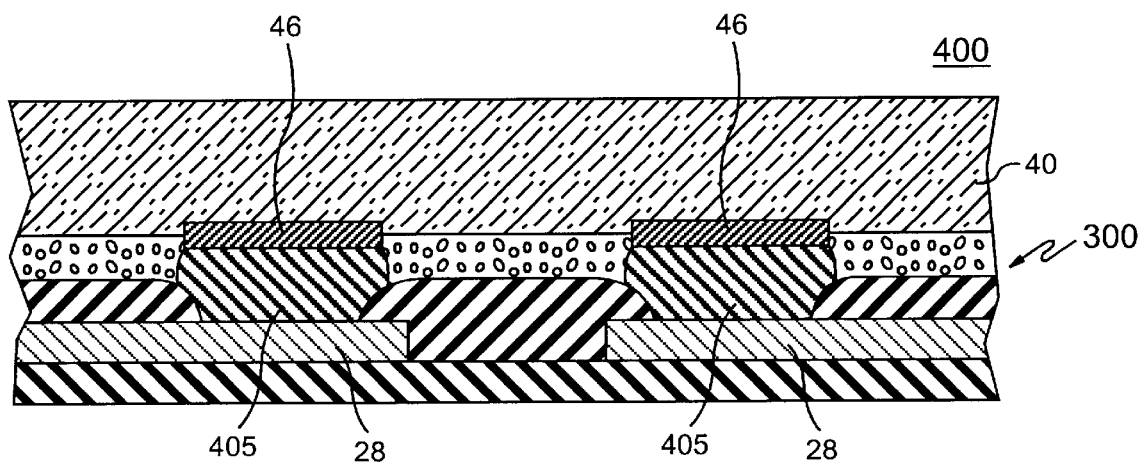
FIG. 4 shows a cross sectional view of the die and the substrate in FIG. 3 after assembly in accordance with the present invention.

FIG. 4, shows a flip chip package 400 formed with solder interconnects 405, in accordance with the present invention between the pads 46 on the die 40 and the terminal locations 28 on the substrate 300.

It will be appreciated by one skilled in the art that the process 300 can also be applied to direct flip chip attach (DCA) where a semiconductor die is mounted directly on a printed circuit board.

Figure 5:
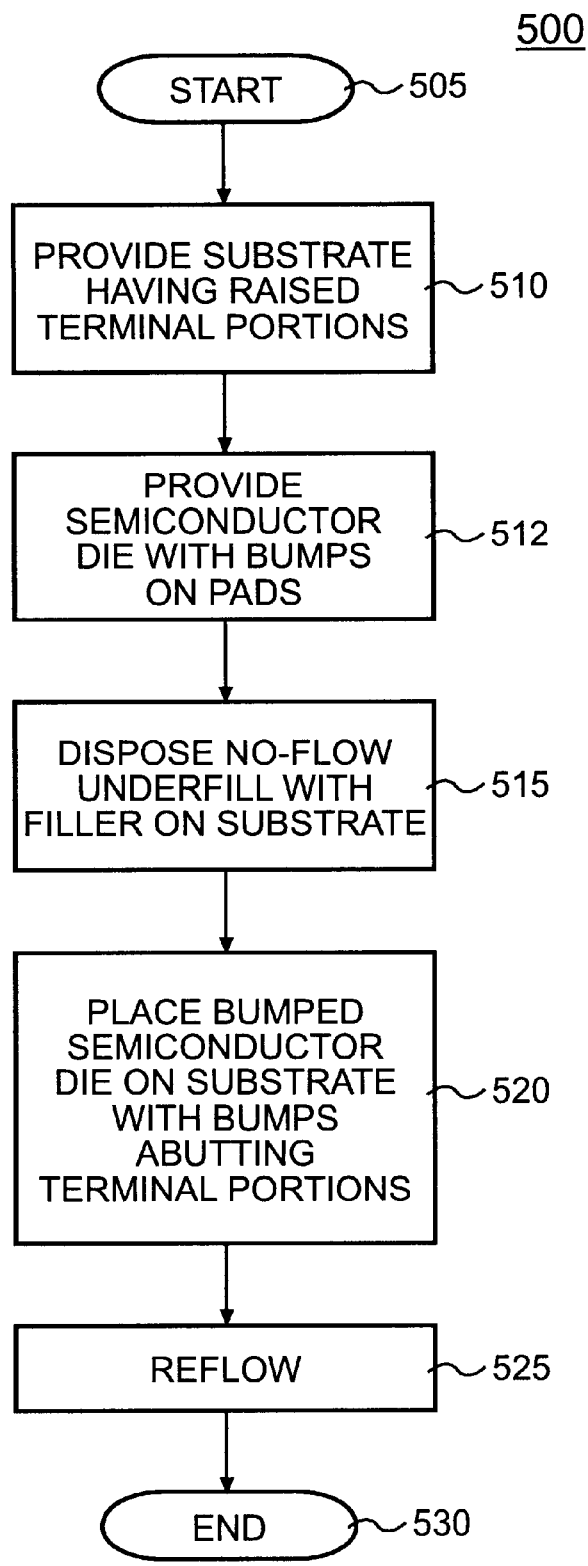
FIG. 5 shows a method of forming the semiconductor package in FIG. 4.

With reference to FIG. 5, a method 500 of forming the no-flow underfilled semiconductor package 400 that uses no-flow underfill 5 containing filler 27, starts 505 by providing 510 the substrate 300 with the raised terminal portions of solder cladding. The substrate 300 can comprise ceramic materials, laminates and flexible material as employed in producing flex circuits. The raised terminal portions 305 can comprise a variety of compositions and structures.

Figure 6A:
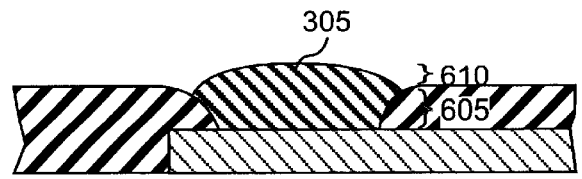
FIGS. 6A–D shows cross-sectional views of a variety of raised terminal portion structures on the substrate in FIG. 3.
Figure 6B:
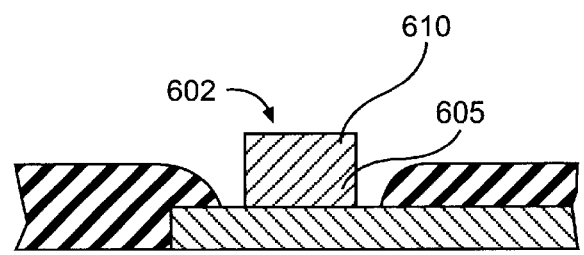
Figure 6C:
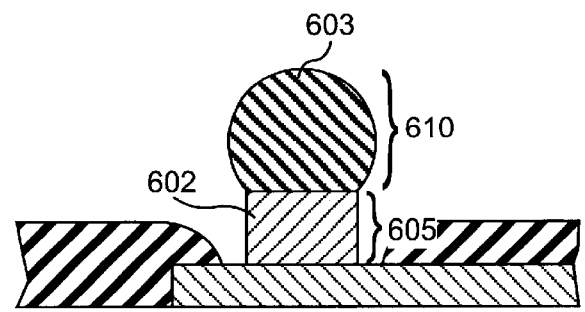
Figure 6D:
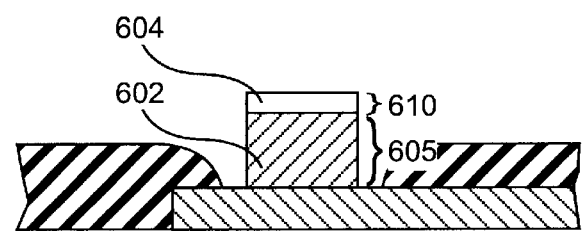

With reference to FIG. 6A the raised terminal portion 305 comprises solder cladding, as mentioned earlier with a base portion 605 and a free-end portion 610. The whole raised terminal portion 305 can also consist of deposits of tin-lead eutectic solder or lead-free solder with base portions and free-end portions. Alternatively, with reference to FIG. 6B, the raised terminal portion 305 can comprise a pillar structure 602 with a base portion 605 and a free end portion 610, where the pillar 602 can be made of copper or gold. With reference to FIG. 6C, the raised terminal portion 305 can comprise the pillar structure 602, forming the base portion 605 and a solder ball 603 forming the free-end portion 610. Here, the free end portion 605 consist of deposits of tin-lead eutectic solder or lead-free solder, and the base portion 610 consist of high lead solder or copper. FIG. 6D shows another structure for the raised terminal portion 305 comprising the pillar structure 602, forming the base portion 605, and a layer of gold or organic solder preservative, forming the free end portion 610. Typically, the layer of gold or organic solder preservative provides a layer of passivation for the copper pillar 602.

When a further layer of material, such as solder, is added to form the free end of the raised terminal portion 305, the base portion of the raised terminal portion 305 may then have an inner part and an outer part. For example, when the raised terminal portion 305 has a structure as shown in FIG. 6D, the base portion can then have a copper inner part and a gold outer part.

Figure 7A:
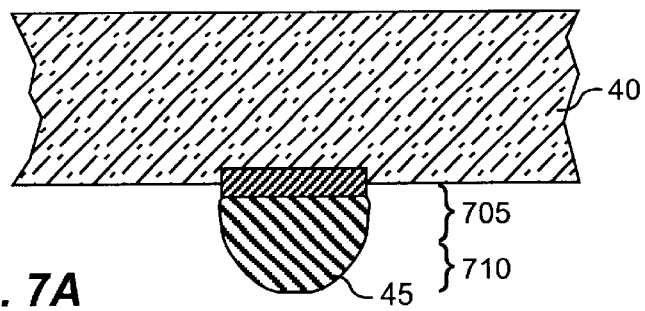
FIGS. 7A–D shows cross-sectional views of a variety of bump structures on the semiconductor die in FIG. 3.
Figure 7B:
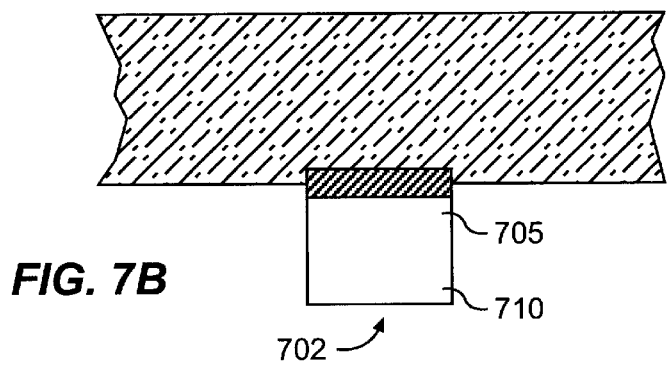
Figure 7C:
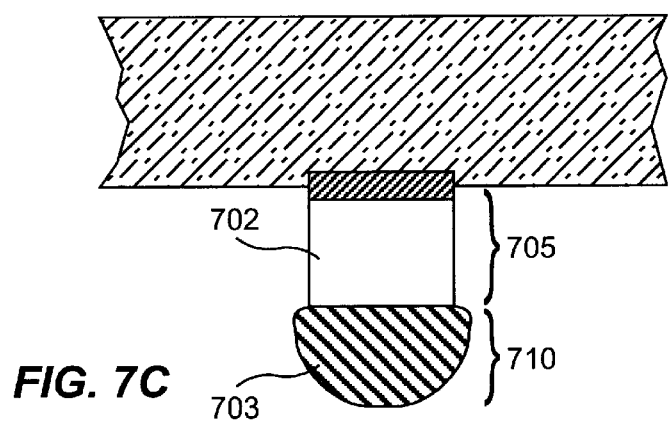
Figure 7D:
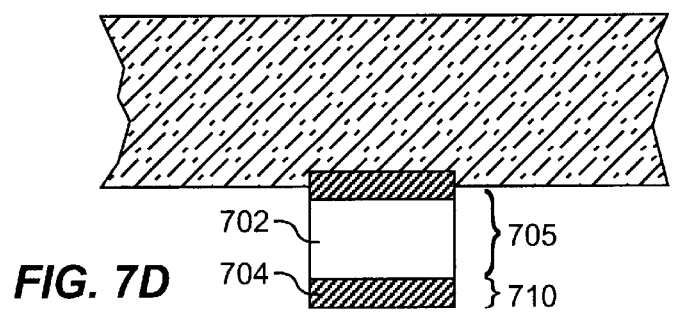

Returning to FIG. 5, next, the semiconductor die 40 having bumps 45 on the pads 46 is provided 512. With reference to FIG. 7A the bump 45 comprises solder, as mentioned earlier with a base portion 705 and a free-end portion 710. The whole bump 45 can also consist of deposits of tin-lead eutectic solder or lead-free solder with base portions and free-end portions. Alternatively, with reference to FIG. 7B, the bump 45 can comprise a pillar structure 702 with a base portion 705 and a free end portion 710, where the pillar 702 can be made of copper or gold. With reference to FIG. 7C, the bump 45 can comprise the pillar structure 602, forming the base portion 705 and a solder ball 703 forming the free-end portion 710. Here, the free end portion 705 consist of deposits of tin-lead eutectic solder or lead-free solder, and the base portion 710 consist of high lead solder or copper. FIG. 7D shows another structure for the bump 45 comprising the pillar structure 702, forming the base portion 705, and a layer of gold or organic solder preservative, forming the free end portion 710. Typically, the layer of gold or organic solder preservative provides a layer of passivation for the copper pillar 702. When a further layer of material, such as solder, is added to form the free end of the bump 45, the base portion of the bump 45 may then have an inner part and an outer part. For example, when the bump 45 has a structure as shown in FIG. 7D, the base portion can then have a copper inner part and a gold outer part.

U.S. patent application Ser. No. 09/564,382 by Francisca Tung, filed on Apr. 27, 2000, titled "Improved Pillar Connections For Semiconductor Chips and Method Of Manufacture", and Continuation-In-Part U.S. patent application Ser. No. (Not yet assigned) by Francisca Tung, filed on Apr. 26, 2000 titled "Improved Pillar Connections For Semiconductor Chips and Method Of Manufacture", and assigned to a common assignee as this patent application, teaches forming at least some of such pillar structures as described herein. These patent applications are incorporated by reference.

Returning again to FIG. 5, the no-flow underfill 5 with filler 27 is then disposed 515 on the substrate 300. The bumped semiconductor die 40 is then placed 520 on the substrate 300 with the bumps 45 abutting the upper surfaces 310 of the raised terminal portions 305. The assembly is then reflowed 525 which causes the solder bumps 45 and the raised terminal portions, to change to a molten state. The molten solder displaces the filler 27 in the underfill 5, away from between the bump 45 and the raised terminal portions 305, and forms solder interconnects 405 between the pads 46 and the terminal locations 28. The method 500 then ends 530.

Any combination of the pillar structures and material in FIGS. 6 and 7 can be employed provided that either the bump 45 or the raised terminal portion 305 is reflowable, or at least the free end portion of either the bump 45 or the raised terminal portion is reflowable. Reflowable material here refers to material having a relatively lower temperature at which the material melts when compared to material used for the base portions 610 and 710 and the outer parts 620 and 720. The reflowable material includes deposits of tin-lead eutectic solder or lead-free solder.

Thus, the present invention as described, advantageously displaces filler, such as silica, in the underfill from between the solder bumps and the terminals on the substrate, thereby preventing the formation of a barrier, and the resultant occurrence of open circuits in a flip chip semiconductor package.

Figure 8:
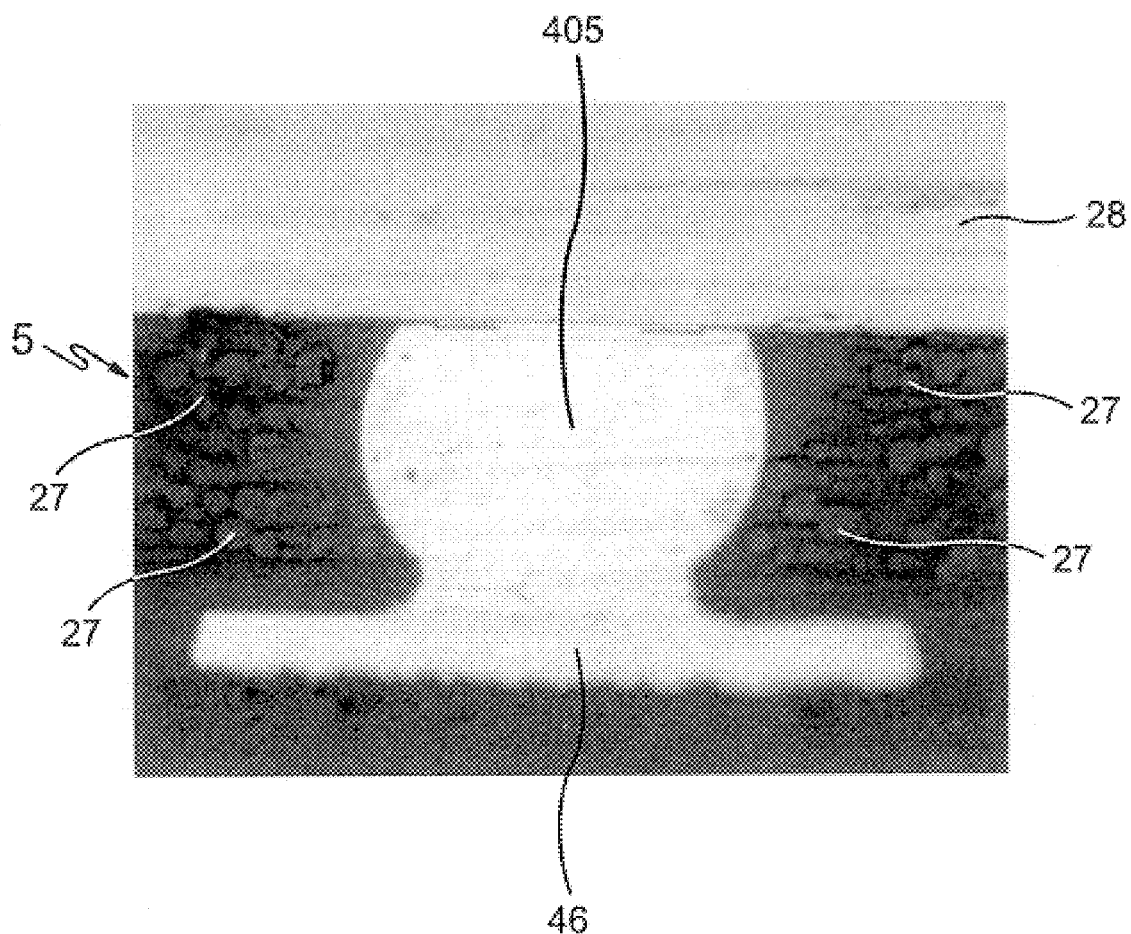
FIG. 8 shows a photograph of the cross-section of a solder interconnect between the die and the substrate in FIG. 4.

FIG. 8 is a photograph, which shows a side sectional view of the interconnect 405 between the pad 46 and the terminal portion 28. The interconnect 405 is centrally located in the photograph, and the filler 27 in the underfill 5 surrounds the interconnect 405.

Figure 9:
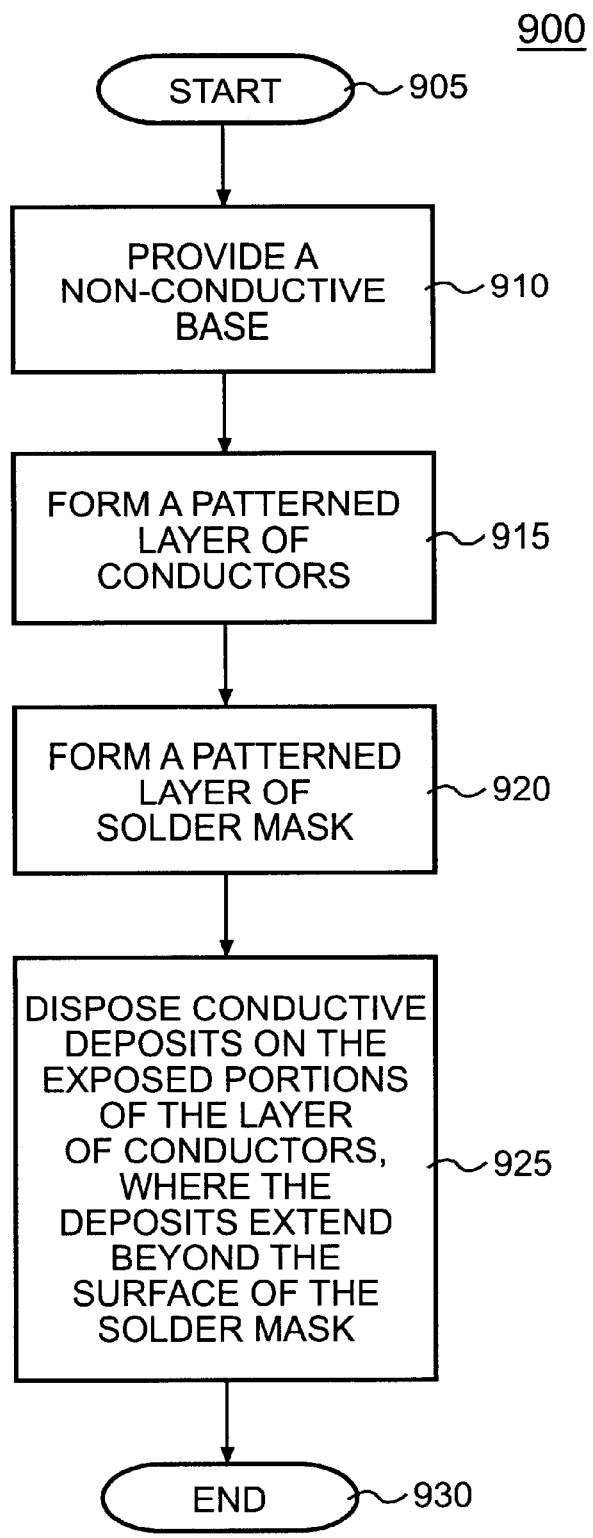
FIG. 9 shows a method of forming the substrate in FIG. 3.

In FIG. 9, and with occasional reference to FIG. 3, a process 900 for forming the substrate 300, starts 905 by providing the non-conductive base 12. The non-conductive base 12 can include any one of the following materials: ceramic, rigid and flexible organic laminate. A patterned layer of conductors 25 is then formed 915 on the base layer 12. Typically, an assembly of the base layer 12 having an unpatterned layer of copper is available from vendors. When this assembly is used, a layer of photoresist, a photolithographic process, an etchant, and a photoresist stripper, are employed to form the layer of copper into the patterned layer 25 on the base layer 12, in accordance with a predetermined conductive distribution pattern, as is known in the art.

Using a similar photolithographic process as mentioned earlier, the patterned layer of solder mask 20 is formed 920 on the patterned layer of conductors 25. The layer of solder mask 20 covers and insulates non-terminal portions of the patterned layer of conductors 25, and surrounds and defines the terminal locations 28 of the patterned layer of conductors 25.

The raised terminal portions 305 are then formed 925 on the exposed upper surfaces 26 of the terminal locations 28. In accordance with the present invention, the raised terminal portions 305 are disposed to a predetermined height that exceeds the height of the exposed upper layer of solder mask 20. The process 900 ends, thus providing the substrate 300.

Forming the raised terminal portions 305 can be achieved by depositing materials including tin-lead eutectic solder or lead-free solder or forming solder cladding on the terminal locations 28. Dependent on the composition and structure of the raised terminal portions 305, a variety of processes, as will be known to one skilled in the art, including coating, printing and plating, to form the raised terminal portions 305.

It will be appreciated by one skilled in the art, that conventional substrates can advantageously be processed to form solder cladding or the pillar structures, in accordance with the present invention, to the terminal portions. Thus, the present invention, as described, advantageously allows conventional substrates to be processed to have the same advantages associated with the substrate of the present invention.

It will also be appreciated by one skilled in the art, that substrate manufacturing facilities that produce substrates using conventional processes, can advantageously include the necessary equipment to form the raised terminal portions, in accordance with the present invention, as described, and to produce substrates in accordance with the present invention. Hence, the present invention as described, advantageously allows conventional substrate producing facilities to include the raised terminal portions and produce substrates in accordance with the present invention.

The present invention, as described, provides a method of forming an underfilled semiconductor package that uses no-flow underfill with filler which is more reliable, particularly when packaging larger semiconductor dies.

This is accomplished by employing a substrate having raised terminal portions. When a bumped semiconductor die is placed on the substrate, the bumps abut the upper surfaces of the raised terminal portions. During reflow, the molten bumps and raised terminal portions displace filler in the underfill, and prevent the filler from forming a barrier between the bumps and the raised terminal portions, thus allowing more reliable connections to be formed.

The present invention provides a method for forming an underfilled semiconductor package, a semiconductor package formed thereby, and a substrate therefor, which overcomes or at least reduces the abovementioned problems of the prior art.

It will be appreciated that although only one particular embodiment of the invention has been described in detail, various modifications and improvements can be made by a person skilled in the art without departing from the scope of the present invention.

What is claimed is:

1. A method for forming a flip chip semiconductor package, the method comprising the steps of:
   a) providing a substrate having a first surface with plurality of raised terminal portions, wherein the plurality of raised terminal portions extend to at least the first surface, each of the raised terminal portions comprising a base portion and a free end portion, and at least the free end portions consisting of a first material having a first reflow temperature;
   b) providing a semiconductor die having a plurality of pads on a first surface, wherein the plurality of pads have bumps thereon, each of the bumps comprising a base portion and a free end portion, at least the free end portions of the plurality of bumps consisting of the first material;
   c) providing an underfill compound, wherein the underfill compound includes at least some inorganic filler to reduce the coefficient of thermal expansion (CTE) of the underfill compound;
   d) disposing the underfill compound on the substrate;
   e) placing the semiconductor die on the substrate with the underfill compound therebetween, wherein the free end portions of the plurality of bumps abut the free end portions of the plurality of raised terminal portions; and
   f) reflowing the semiconductor die, the substrate and the underfill compound at substantially the first reflow temperature to form the at least the free end portions of the plurality of bumps and the at least the free end portions of the plurality of raised terminal portions into interconnects.

2. A method in accordance with claim 1 wherein step (b) comprises the step of providing the semiconductor die having the plurality of pads on the first surface, wherein the plurality of pads have the bumps thereon, each of the bumps comprising the base portion and the free end portion, wherein the free end portion consist of the first material, and wherein the base portion consist of a second material having a second reflow temperature which is higher than the first reflow temperature.

3. A method in accordance with claim 1 wherein step (b) comprises a step of providing a semiconductor die having a plurality of pads on a first surface, wherein the plurality of pads have bumps thereon, each of the bumps comprising a base portion and a free end portion, and wherein the base portion and the free end portion consist of a second material, the second material having a second reflow temperature which is higher than the first reflow temperature.

4. A method in accordance with claim 3 wherein step (b) comprises the step of providing the semiconductor die having the plurality of pads on the first surface, wherein the plurality of pads have the bumps thereon, each of the bumps comprising the base portion and the free end portion, wherein the base portion comprises an inner part and an outer part, wherein the inner part and the outer part consist of the second material and the free end portion consist of a third material, the third material being different from the first and second material.

5. A method in accordance with claim 4 wherein step (a) comprises the step of providing the substrate having the plurality of raised terminal portions on the first surface, wherein the plurality of raised terminal portions extend to at least the first surface, each of the raised terminal portions comprising the base portion and the free end portion, wherein the base portion comprises an inner part and an outer part, wherein the inner part and the outer part consist of the second material, and wherein the free end portion consist of the first material.

6. A method in accordance with claim 5 wherein step (a) comprises the step of providing the substrate having the plurality of raised terminal portions on the first surface, wherein the plurality of raised terminal portions extend to at least the first surface, each of the raised terminal portions comprising the base portion and the free end portion, wherein the base portion comprises the inner part and the outer part, wherein the inner part consist of the second material and the outer part consist of the third material and the free end portion consist of the first material.

7. A method in accordance with claim 4 wherein step (b) comprises the step of providing the semiconductor die having the plurality of pads on the first surface, wherein the plurality of pads have the bumps thereon, each of the bumps comprising the base portion and the free end portion, wherein the base portion comprises the inner part and the outer part, wherein the inner part consist of the second material, the outer part consist of the third material and the free end portion consist of the first material.

8. A method in accordance with claim 3 wherein step (a) comprises the step of providing the substrate having the plurality of raised terminal portions on the first surface, wherein the plurality of raised terminal portions extend to at least the first surface, each of the raised terminal portions comprising the base portion and the free end portion, wherein the base portion comprises an inner part and an outer part, wherein the inner part and the outer part consist of the second material, and wherein the free end portion consist of the first material.

9. A method in accordance with claim 8 wherein step (a) comprises the step of providing the substrate having the plurality of raised terminal portions on the first surface, wherein the plurality of raised terminal portions extend to at least the first surface, each of the raised terminal portions comprising the base portion and the free end portion, wherein the base portion comprises an inner part and an outer part, wherein the inner part consist of the second material and the outer part consist of a third material, the third material being different from the first and second material, and the free end portion consist of the first material.

10. A method in accordance with claim 1 wherein step (a) comprises the step of providing the substrate having the plurality of raised terminal portions on the first surface, wherein the plurality of raised terminal portions extend to at least the first surface, each of the raised terminal portions comprising the base portion and the free end portion, wherein the free end portion consist of the first material, and wherein the base portion consist of a second material having a second reflow temperature which is higher than the first reflow temperature.

11. A method in accordance with claim 1 wherein step (a) comprises a step of providing a substrate having a plurality of raised terminal portions on a first surface, wherein the plurality of raised terminal portions extend to at least the first surface, each of the raised terminal portions comprising a base portion and a free end portion, wherein the free end portion and the base portion consist of a second material, the second material having a second reflow temperature which is higher than the first reflow temperature.

12. A method in accordance with claim 11 wherein step (a) comprises the step of providing the substrate having the plurality of raised terminal portions on the first surface, wherein the plurality of raised terminal portions extend to at least the first surface, each of the raised terminal portions comprising the base portion and the free end portion, wherein the base portion comprises an inner part and an outer part, and wherein the inner part and the outer part consist of the second material, and the free end portion consist of a third material, different from the first and second materials.

13. A method in accordance with claim 12 wherein step (b) comprises the step of providing the semiconductor die having the plurality of pads on the first surface, wherein the plurality of pads have the bumps thereon, each of the bumps comprising the base portion and the free end portion, wherein the free end portion consist of the first material, and wherein the base portion consist of the second material.

14. A method in accordance with claim 13 wherein step (b) comprises the step of providing the semiconductor die having the plurality of pads on the first surface, wherein the plurality of pads have the bumps thereon, each of the bumps comprising the base portion and the free end portion, wherein the base portion comprises an inner part and an outer part, wherein the inner part consist of the second material and the outer part consist a third material, the third material being different from the first and second material, and wherein the free end portion consist of the first material.

15. A method in accordance with claim 12 wherein step (a) comprises the step of providing the substrate having the plurality of raised terminal portions on the first surface, wherein the plurality of raised terminal portions extend to at least the first surface, each of the raised terminal portions comprising the base portion and the free end portion, wherein the base portion comprises the inner part and the outer part, and wherein the inner part consist of the second material and the outer part consist of the third material, and the free end portion consist of the first material.

16. A method in accordance with claim 11 wherein step (b) comprises the step of providing the semiconductor die having the plurality of pads on the first surface, wherein the plurality of pads have the bumps thereon, each of the bumps comprising the base portion and the free end portion, wherein the free end portion consist of the first material, and wherein the base portion consist of the second material.

17. A method in accordance with claim 16 wherein step (b) comprises the step of providing the semiconductor die having the plurality of pads on the first surface, wherein the plurality of pads have the bumps thereon, each of the bumps comprising the base portion and the free end portion, wherein the base portion comprises an inner part and an outer part, wherein the inner part consist of the second material and the outer part consist a third material, the third material being different from the first and second material, and wherein the free end portion consist of the first material.

18. A method for forming a flip chip semiconductor package, the method comprising the steps of:
   a) providing a substrate having a first surface with a plurality of raised terminal portions, wherein the plurality of raised terminal portions extend to at least the first surface, each of the raised terminal portions comprising a base portion and a free end portion, at least the free end portions consisting of a first material having a first reflow temperature, wherein the first material is selected from the group consisting of tin-lead eutectic solder and lead-free solder;
   b) providing a semiconductor die having a plurality of pads on a first surface, wherein the plurality of pads have bumps thereon, each of the bumps comprising a base portion and a free end portion, at least the free end portions of the plurality of bumps consisting of the first material;
   c) providing an underfill compound, wherein the underfill compound includes at least some inorganic filler to reduce the coefficient of thermal expansion (CTE) of the underfill compound, wherein the inorganic filler is selected from the group consisting of silica, silicon nitride, boron nitride, and aluminum nitride;
   d) disposing the underfill compound on the substrate;
   e) placing the semiconductor die on the substrate with the underfill compound therebetween, wherein the free end portions of the plurality of bumps abut the free end portions of the plurality of raised terminal portions; and
   f) reflowing the semiconductor die, the substrate and the underfill compound at substantially the first reflow temperature to form the at least the free end portions of the plurality of bumps and the at least the free end portions of the plurality of raised terminal portions into interconnects.

19. A method in accordance with claim 18 wherein step (b) comprises the step of providing the semiconductor die having the plurality of pads on the first surface, wherein the plurality of pads have the bumps thereon, each of the bumps comprising the base portion and the free end portion, wherein the free end portion consist of the first material, wherein the base portion consist of a second material having a second reflow temperature which is higher than the first reflow temperature, and wherein the second material is selected from the group consisting of high lead solder and copper.

20. A method in accordance with claim 18 wherein step (b) comprises a step of providing a semiconductor die having a plurality of pads on a first surface, wherein the plurality of pads have bumps thereon, each of the bumps comprising a base portion and a free end portion, and wherein the base portion and the free end portion consist of a second material, the second material having a second reflow temperature which is higher than the first reflow temperature, and wherein the second material is selected from the group consisting of high lead solder, copper and gold.

21. A method in accordance with claim 20 wherein step (b) comprises the step of providing the semiconductor die having the plurality of pads on the first surface, wherein the plurality of pads have the bumps thereon, each of the bumps comprising the base portion and the free end portion, wherein the base portion comprises an inner part and an outer part, wherein the inner part and the outer part consist of the second material and the free end portion consist of a third material, the third material being different from the first and second material, wherein the third material is selected from the group consisting of gold and organic solder preservative.

22. A method in accordance with claim 21 wherein step (a) comprises the step of providing the substrate having the plurality of raised terminal portions on the first surface, wherein the plurality of raised terminal portions extend to at least the first surface, each of the raised terminal portions comprising the base portion and the free end portion, wherein the base portion comprises an inner part and an outer part, wherein the inner part and the outer part consist of the second material, and wherein the free end portion consist of the first material.

23. A method in accordance with claim 22 wherein step (a) comprises the step of providing the substrate having the plurality of raised terminal portions on the first surface, wherein the plurality of raised terminal portions extend to at least the first surface, each of the raised terminal portions comprising the base portion and the free end portion, wherein the base portion comprises the inner part and the outer part, wherein the inner part consist of the second material and the outer part consist of the third material and the free end portion consist of the first material.

24. A method in accordance with claim 21 wherein step (b) comprises the step of providing the semiconductor die having the plurality of pads on the first surface, wherein the plurality of pads have the bumps thereon, each of the bumps comprising the base portion and the free end portion, wherein the base portion comprises the inner part and the outer part, wherein the inner part consist of the second material, the outer part consist of the third material and the free end portion consist of the first material.

25. A method in accordance with claim 20 wherein step (a) comprises the step of providing the substrate having the plurality of raised terminal portions on the first surface, wherein the plurality of raised terminal portions extend to at least the first surface, each of the raised terminal portions comprising the base portion and the free end portion, wherein the base portion comprises an inner part and an outer part, wherein the inner part and the outer part consist of the second material, and wherein the free end portion consist of the first material.

26. A method in accordance with claim 25 wherein step (a) comprises the step of providing the substrate having the plurality of raised terminal portions on the first surface, wherein the plurality of raised terminal portions extend to at least the first surface, each of the raised terminal portions comprising the base portion and the free end portion, wherein the base portion comprises an inner part and an outer part, wherein the inner part consist of the second material and the outer part consist of a third material, the third material being different from the first and second material, and the free end portion consist of the first material, wherein the third material is selected from the group consisting of gold and organic solder preservative.

27. A method in accordance with claim 18 wherein step (a) comprises the step of providing the substrate having the plurality of raised terminal portions on the first surface, wherein the plurality of raised terminal portions extend to at least the first surface, each of the raised terminal portions comprising the base portion and the free end portion, wherein the free end portion consist of the first material, wherein the base portion consist of a second material having a second reflow temperature which is higher than the first reflow temperature, and wherein the second material is selected from the group consisting of high lead solder and copper.

28. A method in accordance with claim 18 wherein step (a) comprises a step of providing a substrate having a plurality of raised terminal portions on a first surface, wherein the plurality of raised terminal portions extend to at least the first surface, each of the raised terminal portions comprising a base portion and a free end portion, wherein the free end portion and the base portion consist of a second material, the second material having a second reflow temperature which is higher than the first reflow temperature, and wherein the second material is selected from the group consisting of high lead solder, copper and gold.

29. A method in accordance with claim 28 wherein step (a) comprises the step of providing the substrate having the plurality of raised terminal portions on the first surface, wherein the plurality of raised terminal portions extend to at least the first surface, each of the raised terminal portions comprising the base portion and the free end portion, wherein the base portion comprises an inner part and an outer part, and wherein the inner part and the outer part consist of the second material, and the free end portion consist of a third material, different from the first and second materials, wherein the third material is selected from the group consisting of gold and organic solder preservative.

30. A method in accordance with claim 29 wherein step (b) comprises the step of providing the semiconductor die having the plurality of pads on the first surface, wherein the plurality of pads have the bumps thereon, each of the bumps comprising the base portion and the free end portion, wherein the free end portion consist of the first material, and wherein the base portion consist of the second material.

31. A method in accordance with claim 30 wherein step (b) comprises the step of providing the semiconductor die having the plurality of pads on the first surface, wherein the plurality of pads have the bumps thereon, each of the bumps comprising the base portion and the free end portion, wherein the base portion comprises an inner part and an outer part, wherein the inner part consist of the second material and the outer part consist a third material, the third material being different from the first and second material, wherein the free end portion consist of the first material, and wherein the third material is selected from the group consisting of gold and organic solder preservative.

32. A method in accordance with claim 29 wherein step (a) comprises the step of providing the substrate having the plurality of raised terminal portions on the first surface, wherein the plurality of raised terminal portions extend to at least the first surface, each of the raised terminal portions comprising the base portion and the free end portion, wherein the base portion comprises the inner part and the outer part, and wherein the inner part consist of the second material and the outer part consist of the third material, and the free end portion consist of the first material.

33. A method in accordance with claim 28 wherein step (b) comprises the step of providing the semiconductor die having the plurality of pads on the first surface, wherein the plurality of pads have the bumps thereon, each of the bumps comprising the base portion and the free end portion, wherein the free end portion consist of the first material, and wherein the base portion consist of the second material.

34. A method in accordance with claim 33 wherein step (b) comprises the step of providing the semiconductor die having the plurality of pads on the first surface, wherein the plurality of pads have the bumps thereon, each of the bumps comprising the base portion and the free end portion, wherein the base portion comprises an inner part and an outer part, wherein the inner part consist of the second material and the outer part consist a third material, the third material being different from the first and second material, wherein the free end portion consist of the first material, and wherein the third material is selected from the group consisting of gold and organic solder preservative.

* * * * *